United States Patent
Tsai et al.

(10) Patent No.: US 11,152,217 B2
(45) Date of Patent: Oct. 19, 2021

(54) HIGHLY SELECTIVE SILICON OXIDE/SILICON NITRIDE ETCHING BY SELECTIVE BORON NITRIDE OR ALUMINUM NITRIDE DEPOSITION

(71) Applicant: Tokyo Electron Limited, Tokyo (JP)

(72) Inventors: Yu-Hao Tsai, Albany, NY (US); Du Zhang, Albany, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/902,582

(22) Filed: Jun. 16, 2020

(65) Prior Publication Data
US 2020/0402808 A1    Dec. 24, 2020

Related U.S. Application Data

(60) Provisional application No. 62/864,378, filed on Jun. 20, 2019.

(51) Int. Cl.
*H01L 21/306* (2006.01)
*H01L 21/3105* (2006.01)

(52) U.S. Cl.
CPC .. *H01L 21/30621* (2013.01); *H01L 21/31055* (2013.01)

(58) Field of Classification Search
None
See application file for complete search history.

(56) References Cited

U.S. PATENT DOCUMENTS

| | | |
|---|---|---|
| 2005/0106893 A1 | 5/2005 | Wilk |
| 2007/0249182 A1 | 10/2007 | Mani et al. |
| 2016/0260620 A1 | 9/2016 | Briggs et al. |
| 2018/0033608 A1 | 2/2018 | Miyahara et al. |

FOREIGN PATENT DOCUMENTS

JP    2008-078209 A    4/2008

OTHER PUBLICATIONS

M. Matsui et al. "Highly selective SiO2 etching over Si3N4 using a cyclic process with BCl3 and fluorocarbon gas chemistries" Jpn. J. Appl. Phys. 57 (2018) 06JB01-1-06JB01-6.
Korean Intellectual Property Office, International Search Report and Written Opinion for International application No. PCT/US2020/037879, dated Sep. 28, 2020, 14 pages.

*Primary Examiner* — Roberts P Culbert

(57) ABSTRACT

A method for selective etching of silicon oxide relative to silicon nitride includes exposing a substrate to a first gas that forms a first layer on the silicon oxide film and a second layer on the silicon nitride film, where the first gas contains boron, aluminum, or both boron and aluminum, exposing the substrate to a nitrogen-containing gas that reacts with the first layer to form a first nitride layer on the silicon oxide film and reacts with the second layer to form a second nitride layer on the silicon nitride film, where a thickness of the second nitride layer is greater than a thickness of the first nitride layer. The method further includes exposing the substrate to an etching gas that etches the first nitride layer and silicon oxide film, where the second nitride layer protects the silicon nitride film from etching by the etching gas.

20 Claims, 7 Drawing Sheets

HIGHLY SELECTIVE SILICON OXIDE/SILICON NITRIDE ETCHING BY SELECTIVE BORON NITRIDE OR ALUMINUM NITRIDE DEPOSITION

CROSS-REFERENCE TO RELATED APPLICATIONS

This application is related to and claims priority to U.S. Provisional Patent Application Ser. No. 62/864,378 filed on Jun. 20, 2019, the entire contents of which are herein incorporated by reference.

FIELD OF INVENTION

The present invention relates to the field of semiconductor manufacturing and semiconductor devices, and more particularly, to a method of selective etching of silicon oxide relative to silicon nitride.

BACKGROUND OF THE INVENTION

Advanced semiconductor technology development poses a huge challenge as dry etch removal of one material selective to other materials is needed. Selective silicon oxide etching relative to silicon nitride has many applications in semiconductor manufacturing and preferential passivation (mostly carbon-based) has been extensively explored for high etch selectivity when using plasmas containing fluorocarbon (FC) or hydrofluorocarbon (HFC) gases. The need for high etch selectivity is especially critical for devices such as self-aligned contacts (SAC) that having small tolerances on silicon nitride loss.

SUMMARY OF THE INVENTION

A method of selective etching of silicon oxide relative to silicon nitride is disclosed in several embodiments. According to one embodiment, the method includes providing a substrate containing a silicon oxide film and a silicon nitride film, a1) exposing the substrate to a first gas that forms a first layer on the silicon oxide film and a second layer on the silicon nitride film, where the first gas contains boron, aluminum, or both, and a2) exposing the substrate to a nitrogen-containing gas that reacts with the first layer to form a first nitride layer on the silicon oxide film and reacts with the second layer to form a second nitride layer on the silicon nitride film, where a thickness of the second nitride layer is greater than a thickness of the first nitride layer. The method further includes a3) exposing the substrate to an etching gas that etches the first nitride layer and the silicon oxide film, where the second nitride layer protects the silicon nitride film from etching by the etching gas. According to one embodiment, the method further includes a0) exposing the substrate to a $H_2$-containing gas that terminates the silicon oxide film with —OH surface species and terminates the silicon nitride film with —$NH_x$ surface species.

According to one embodiment, the method includes providing a substrate containing a silicon oxide film and a silicon nitride film, a1) exposing the substrate to a $BCl_3$ gas that forms a first $BCl_3$ layer on the silicon oxide film and a second $BCl_3$ layer on the silicon nitride film, and a2) exposing the substrate to $NH_3$ gas that reacts with the first $BCl_3$ layer to form a first boron nitride layer on the silicon oxide film and reacts with the second $BCl_3$ layer to form a second boron nitride layer on the silicon nitride film, where a thickness of the second boron nitride layer is greater than a thickness of the first boron nitride layer. The method further includes a3) exposing the substrate to plasma-excited $CF_4$ gas that etches the first boron nitride layer and silicon oxide film, where the second boron nitride layer protects the silicon nitride film from etching by the etching gas. According to one embodiment, the method further includes a0) exposing the substrate to a $H_2$-containing gas that terminates the silicon oxide film with —OH surface species and terminates the silicon nitride film with —$NH_x$ surface species.

DETAILED DESCRIPTION OF SEVERAL EMBODIMENTS

Figure 1:
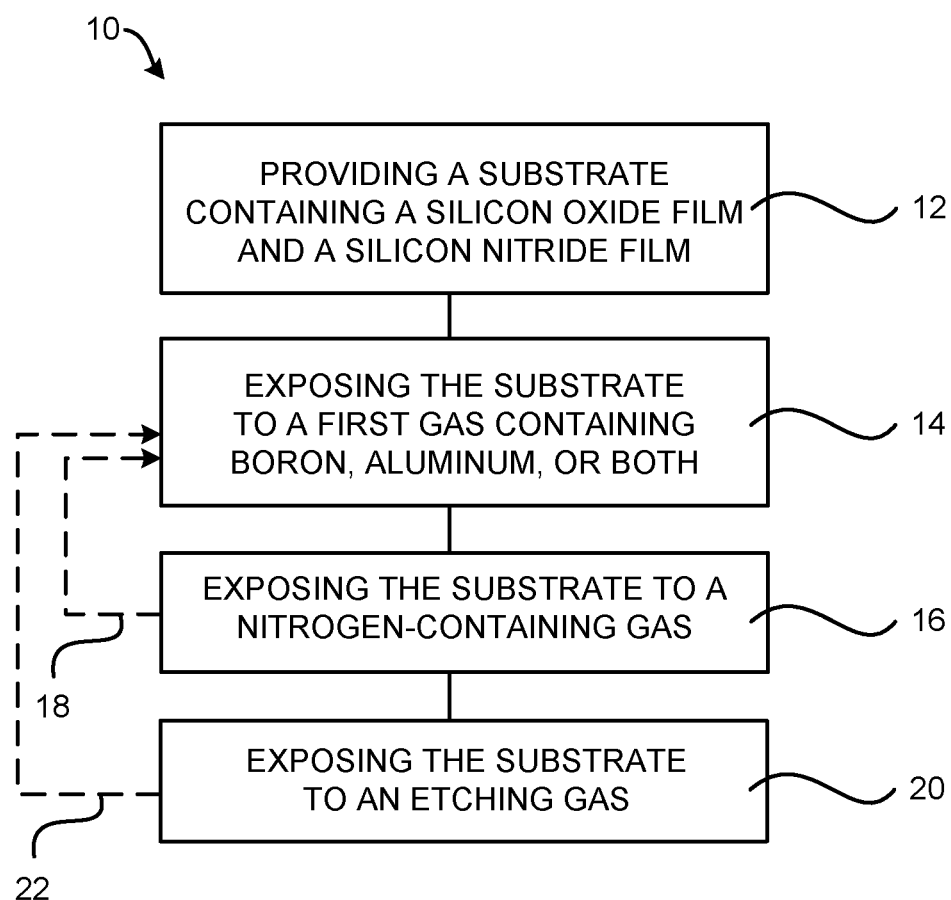
FIG. 1 is a process flow diagram for selective etching of a silicon oxide film relative to a silicon nitride film according to an embodiment of the invention.

FIG. 1 is a process flow diagram for selective etching of a silicon oxide film relative to a silicon nitride film according to an embodiment of the invention, and FIGS. 2A-2D schematically show through cross-sectional views a method of selective etching of a silicon oxide film relative to a silicon nitride film according to an embodiment of the invention.

Figure 2A:
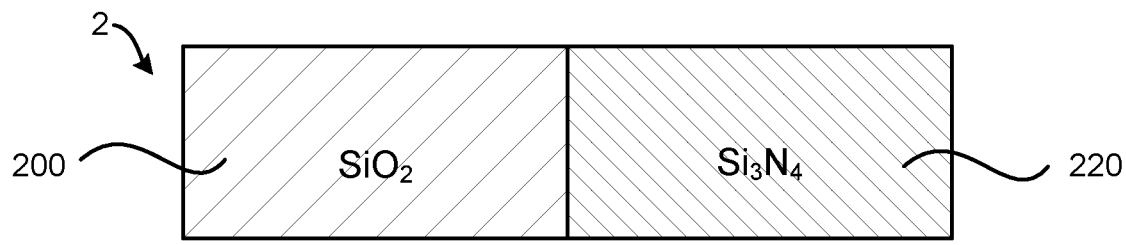
FIGS. 2A-2D schematically show through cross-sectional views a method of selective etching of a silicon oxide film relative to a silicon nitride film according to an embodiment of the invention.

Referring now to FIGS. 1 and 2A, the processing method in the process flow diagram 10 includes, in 12, providing a substrate 2 containing a $SiO_2$ film 200 and a $Si_3N_4$ film 220. In the example shown in FIG. 2A, the $SiO_2$ film 200 and the $Si_3N_4$ film 220 are in the same horizontal plane, but embodiments of the invention may also be applied to films that are not in the same horizontal plane but are offset vertically. $Si_3N_4$ is the most thermodynamically stable of the silicon nitrides and hence the most commercially important of the silicon nitrides. However, embodiments of the invention may be applied to other silicon nitrides that contain Si and N as the major constituents, where the silicon nitrides can have a wide range of Si and N compositions ($Si_xN_y$). Similarly, $SiO_2$ is the most thermodynamically stable of the silicon oxides and hence the most commercially important of the silicon oxides. However, embodiments of the invention may be applied to other silicon oxides that contain Si and O as the major constituents, where the silicon oxides can have a wide range of Si and O compositions ($Si_xO_y$).

Figure 2B:
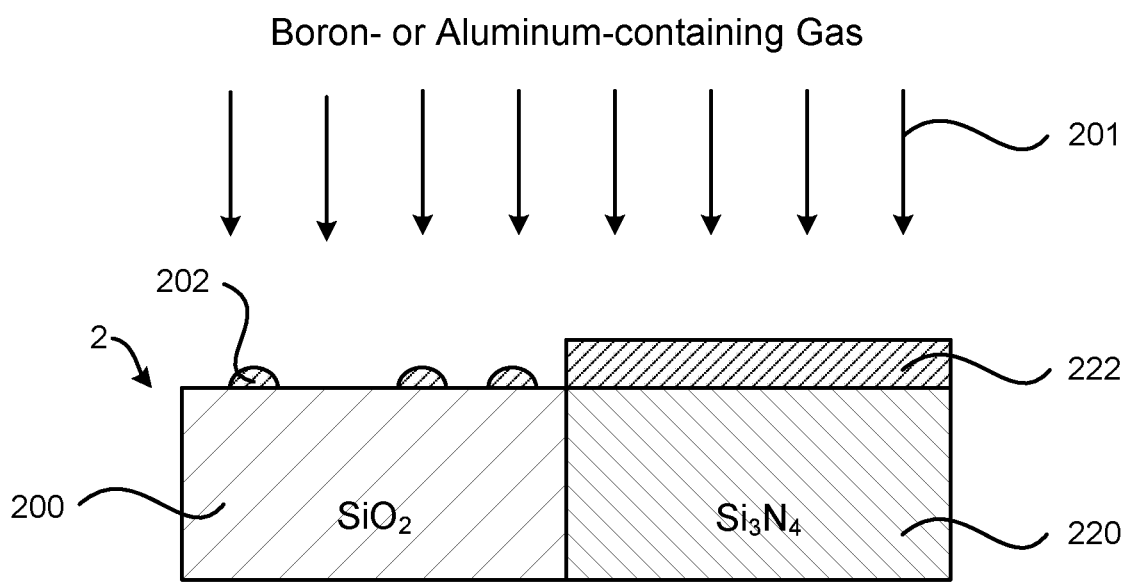

The method further includes, in 14, exposing the substrate 2 to a first gas 201. The first gas 201 can contain boron, aluminum, or both boron and aluminum. The first gas 201 can include a boron hydride, a boron halide, an organoaluminum compound, an aluminum hydride, an aluminum chloride, or a combination thereof. According to one embodiment, the first gas 201 may be selected from the group consisting of $BH_3$, $BCl_3$, $BF_3$, $Al(CH_3)_3$, $AlH_3$, $AlCl_3$, and a combination thereof. The exposure may be performed with or without plasma excitation of the first gas 201. The exposure of the first gas 201 forms a first layer 202 (e.g., $BCl_3$) on the $SiO_2$ film 200 and a second layer 222 (e.g., $BCl_3$) on the $Si_3N_4$ film 220. As schematically shown in FIG. 2B, the first layer 202 is thinner than the second layer 222 and the former may be incomplete with voids that expose the underlying $SiO_2$ film 200. This preferential adsorption of first gas 201 on the $Si_3N_4$ film 220 is attributed to higher adsorption energy of the first gas 201 on the $Si_3N_4$ film 220 than on the $SiO_2$ film 200 and this effect is strongly favored in the absence of plasma excitation or when using remote plasma excitation of the first gas 201.

The method further includes, in 16, exposing the substrate 2 to a nitrogen-containing gas 203. According to one embodiment, the nitrogen-containing gas 203 may be selected from the group consisting of a nitrogen hydride, a nitrogen halide, $N_2$, and a combination thereof. The nitrogen hydride can, for example, include $NH_3$, $N_2H_4$, or a combination thereof. The nitrogen halide can, for example, include $NCl_3$. In one example, the nitrogen-containing gas 203 may be selected from the group consisting of $NH_3$, $N_2H_4$, $NCl_3$, $N_2$, and a combination thereof.

Figure 2C:
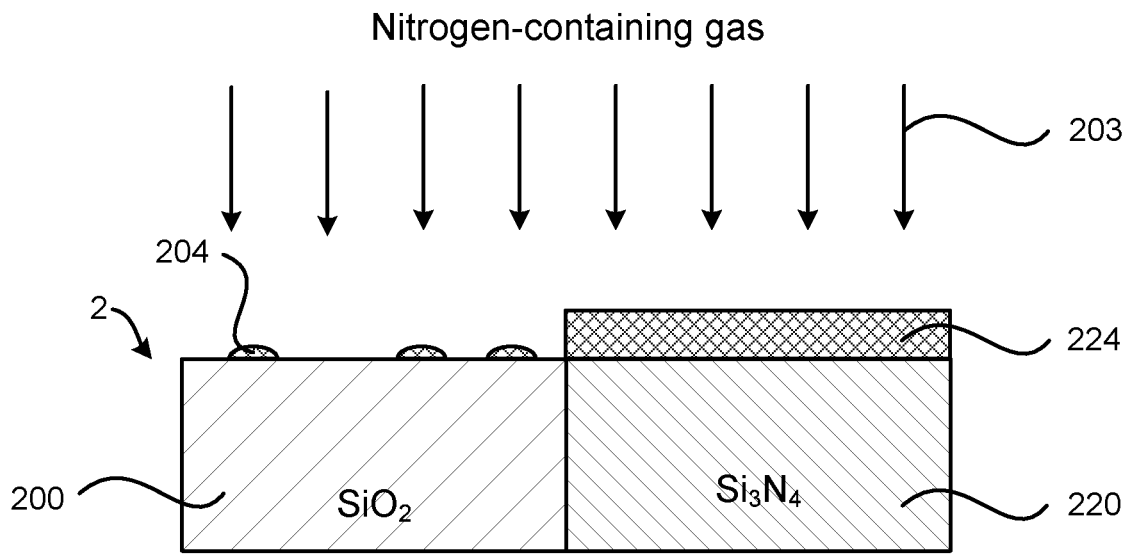

The exposure may be performed with or without plasma excitation of the nitrogen-containing gas 203. The nitrogen-containing gas 203 reacts with the first layer 202 and the second layer 222 to form a first nitride layer 204 and a second nitride layer 224, respectively. The first nitride layer 204 and the second nitride layer 224 can contain boron nitride, aluminum nitride, or both. As schematically shown in FIG. 2C, the first nitride layer 204 may be incomplete with voids that expose the underlying $SiO_2$ film 200. However, this is not required and the first nitride layer may be continuous. The second nitride layer 224 has a greater thickness than the first nitride layer 204 and is at least substantially continuous on the underlying $Si_3N_4$ film 220.

In one example, the first gas 201 contains $BCl_3$ and the nitrogen-containing gas contains $NH_3$. The elementary reaction that forms boron nitride (BN) and volatile HCl byproducts can be represented as:

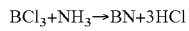

$$BCl_3 + NH_3 \rightarrow BN + 3HCl$$

The formation of boron nitride is thermodynamically favorable and boron nitride provides strong etch protection against various commonly used etching gases.

According to one embodiment, the exposing steps 14 and 16 may performed alternatively and sequentially. According to another embodiment, the exposing steps 14 and 16 may at least partially overlap in time. As shown by the process arrow 18, the exposing steps 14 and 16 may be repeated at least once until the thickness of the second nitride layer 224 is sufficient to act as an etch stop layer, while the thickness of the first nitride layer 204 is not sufficient to protect the $SiO_2$ film 200 in a subsequent etching process.

Figure 2D:
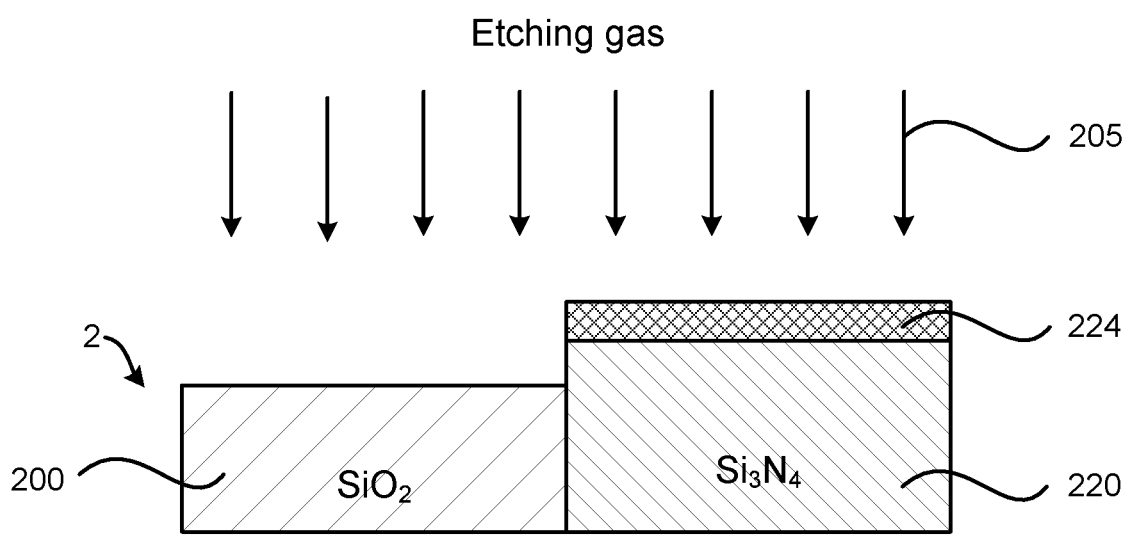

The method further includes, in 20, exposing the substrate 2 to an etching gas 205. This is schematically shown in FIG. 2D. In general, the etching gas 205 may be selected from any gas that etches silicon oxide, boron nitride, and aluminum nitride. The etching gas 205 may be plasma-excited and can contain a fluorocarbon gas, a hydrofluorocarbon gas, a hydrochlorocarbon gas, a hydrochlorofluorocarbon gas, or a combination thereof. In some examples, the etching gas 205 can contain $CF_4$, $CF_2Cl_2$, $CH_2F_2$, $CH_4$, $CH_3F$, $CHF_3$, $C_4H_6$, $C_2H_4$, $C_3H_6$, $CH_2Cl_2$, $CH_3Cl$, $CHCl_2$, $CH_2ClF$, $CHCl_2F$, or a combination thereof. The etching gas 205 can optionally further include Ar, He, or a combination thereof. The exposure to the etching gas 205 etches the first nitride layer 204 and the Sift film 200. Although the second nitride layer 224 is partially etched, the $Si_3N_4$ film 220 is not etched as long as the second nitride layer 224 provides adequate protection against the etching gas 205. In one example, the exposure to the etching gas 205 may be stopped before the second nitride layer 224 ceases to adequately protect the $Si_3N_4$ film 220 from etching.

Plasma excitation of the etching gas 205 may be performed in conventional commercial plasma processing systems, including Inductively Coupled Plasma (ICP) systems, Capacitively Coupled Plasma (CCP) systems, microwave plasma systems, remote plasma systems that generate plasma excited species upstream from the substrate, electron cyclotron resonance (ECR) systems, and other systems.

As shown by the process arrow 22, the exposing steps 14, 16, and 20 may be repeated at least once to redeposit the first nitride layer 204 and the second nitride layer 224 and further etch the $SiO_2$ film 200. According to the embodiment schematically shown in FIG. 2D, the exposure to the etching gas 205 fully removes the first nitride layer 204 from the substrate 2 and etches the $SiO_2$ film 200. According to another embodiment, the exposure to the etching gas 205 may only partially remove the first nitride layer 204 and etch the $SiO_2$ film 200 before exposing steps 14 and 16 are repeated. When the $SiO_2$ film 200 has been adequately etched, the second nitride layer 224 may be removed using dry or wet etching processes that use strong oxidizing agents.

Figure 3:
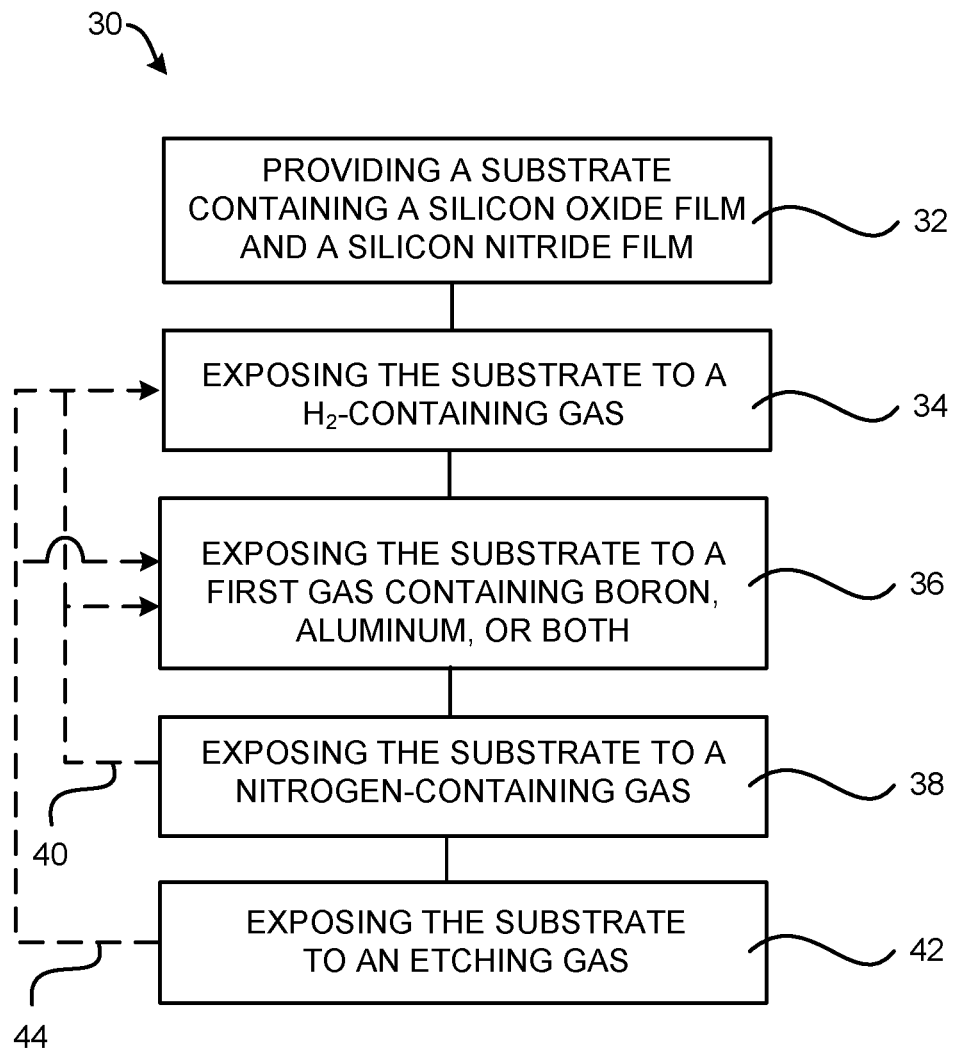
FIG. 3 is a process flow diagram for selective etching of a silicon oxide film relative to a silicon nitride film according to an embodiment of the invention.

FIG. 3 is a process flow diagram for selective etching of a silicon oxide film relative to a silicon nitride film according to an embodiment of the invention, and FIGS. 4A-4E schematically show through cross-sectional views a method of selective etching of a silicon oxide film relative to a silicon nitride film according to an embodiment of the invention. The processing method in the process flow diagram 30 is similar to the process flow diagram 10 in FIG. 1 but the former further includes a pre-treatment step of exposing the substrate to a $H_2$-containing gas that enhances the preferential formation of a first layer on a silicon nitride film relative to on a silicon oxide film, and thereby enhances the subsequent formation of a nitride layer on the silicon nitride film.

Figure 4A:
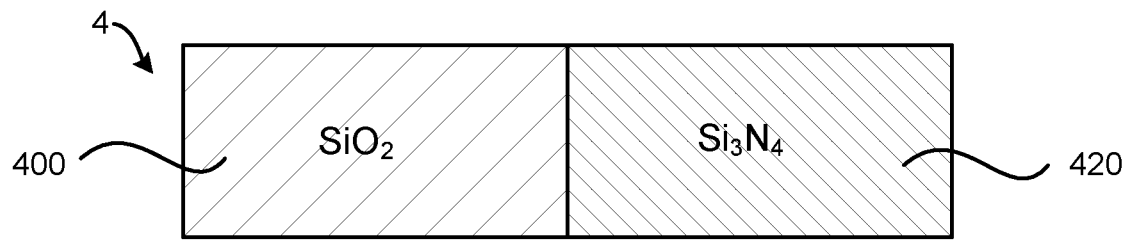
FIGS. 4A-4E schematically show through cross-sectional views a method of selective etching of a silicon oxide film relative to a silicon nitride film according to an embodiment of the invention.
Figure 4B:
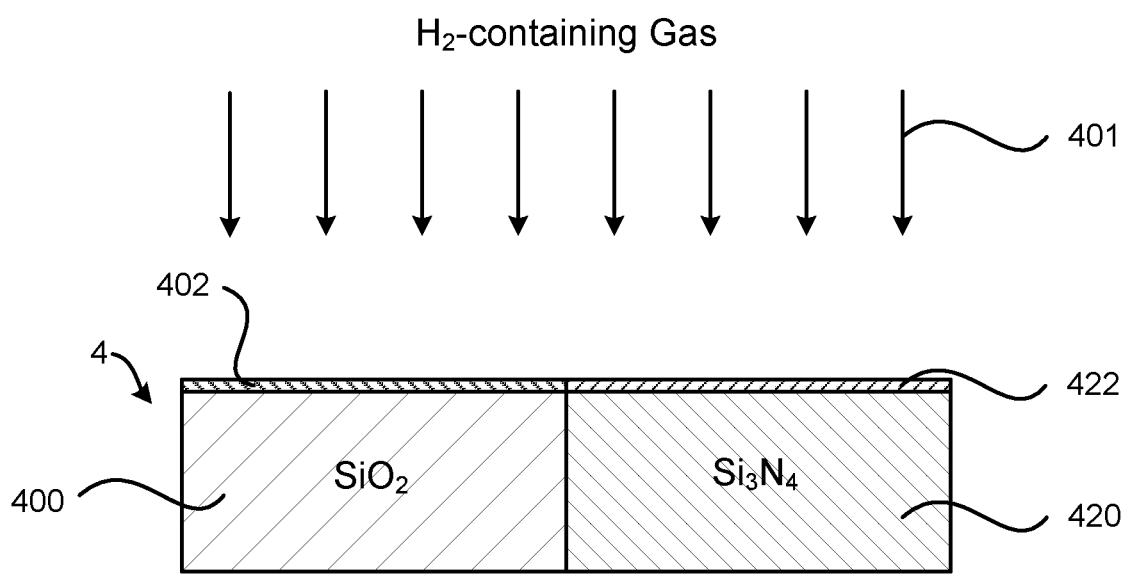

The process flow diagram 30 includes, in 32, providing a substrate 4 containing a $SiO_2$ film 400 and a $Si_3N_4$ film 420. This is schematically shown in FIG. 4A. Thereafter, in 34, the method includes exposing the substrate 4 to a $H_2$-containing gas 401. This is schematically shown in FIG. 4B. The exposure to the $H_2$-containing gas 401 results in termination of the $SiO_2$ film 400 with a —OH surface 402 and termination of the $Si_3N_4$ film 420 with a —$NH_x$ surface 422.

Figure 4C:
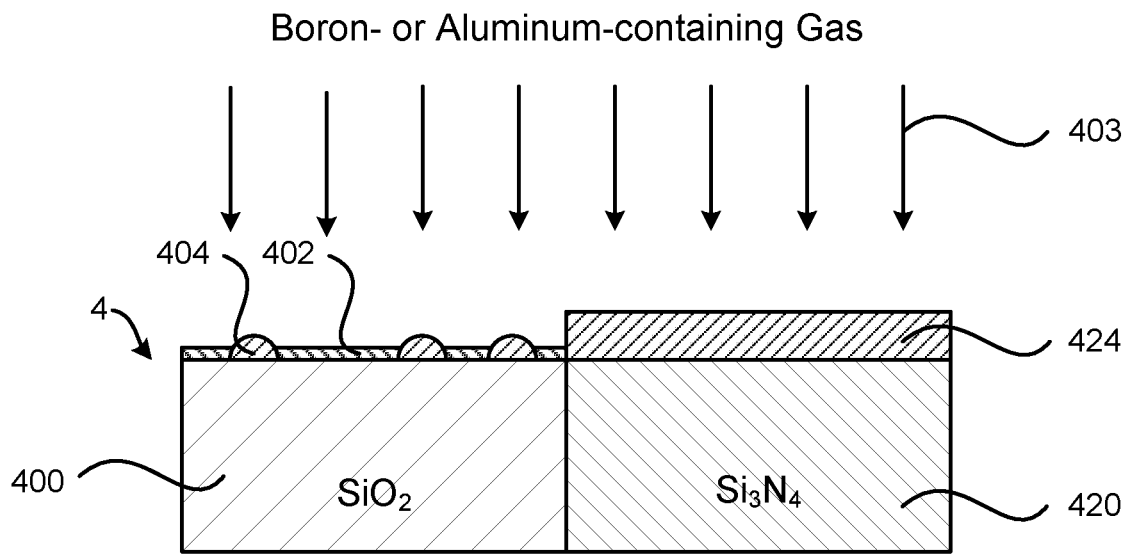
Figure 4D:
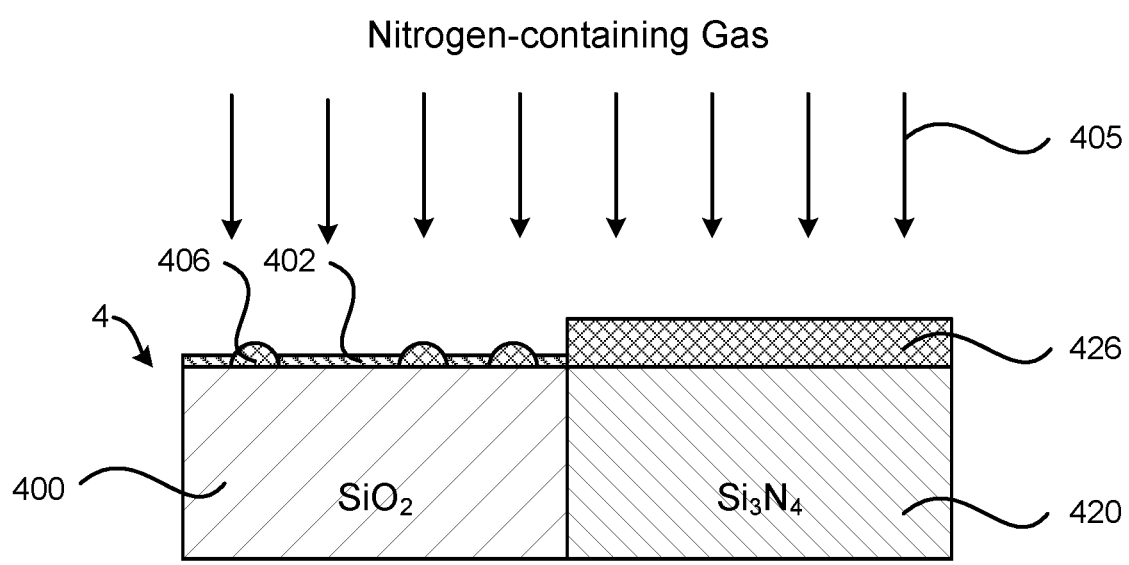

The method further includes, in 36, exposing the substrate 4 to a first gas 403. The exposure to the first gas 403 forms a first layer 404 (e.g., $BCl_3$) on the $SiO_2$ film 400 and a second layer 424 (e.g., $BCl_3$) on the $Si_3N_4$ film 420. This is schematically shown in FIG. 4C.

The method further includes, in 38, exposing the substrate 4 to nitrogen-containing gas 405. The nitrogen-containing gas 405 reacts with the first layer 404 and the second layer 424 to form a first nitride layer 406 and a second nitride layer 426, respectively. According to one embodiment, the exposing steps 34, 36 and 38 may performed alternatively and sequentially. According to another embodiment, the exposing steps 34, 36 and 38 may at least partially overlap in time. As shown by the process arrow 40, the exposing steps 34, 36, and 38 or the exposing steps 36 and 38 may be repeated at least once until the thickness of the second nitride layer 426 is sufficient to act as an etch stop layer, while the thickness of the first nitride layer 406 is not sufficient to protect the SiO₂ film 400 during a subsequent etching process.

Figure 4E:
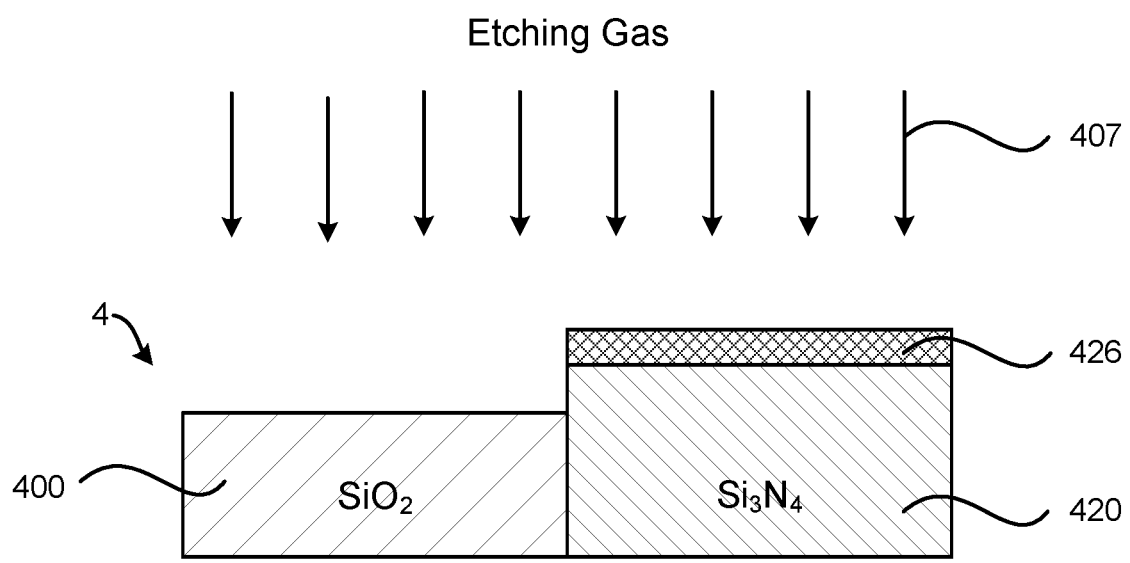

The method further includes, in 42, exposing the substrate 4 to an etching gas 407. This is schematically shown in FIG. 4E. The exposure to the etching gas 407 etches the first nitride layer 406 and the SiO₂ film 400. Although the second nitride layer 426 is partially etched, the Si₃N₄ film 420 is not etched as long as the second nitride layer 426 provides adequate protection against the etching gas 407. In one example, the exposure to the etching gas 407 may be stopped before the second nitride layer 426 ceases to adequately protect the Si₃N₄ film 420 from etching.

As shown by the process arrow 44, the exposing steps 34, 36, 38, and 42 may be repeated at least once to redeposit the first nitride layer 406 and the second nitride layer 426 and further etch the SiO₂ film 400. According to the embodiment schematically shown in FIG. 4E, the exposure to the etching gas 407 fully removes the first nitride layer 406 from the substrate 4 and etches the SiO₂ film 400. According to another embodiment, the exposure to the etching gas 407 may only partially remove the first nitride layer 406 and etch the SiO₂ film 400 before exposing steps 36, 38, and 42, or before exposing steps 34, 36, 38, and 42, are repeated.

A plurality of embodiments for selective etching of silicon oxide relative to silicon nitride have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a substrate containing a silicon oxide film and a silicon nitride film;
   a1) exposing the substrate to a first gas that forms a first layer on the silicon oxide film and a second layer on the silicon nitride film, wherein the first gas contains boron, aluminum, or both boron and aluminum;
   a2) exposing the substrate to a nitrogen-containing gas that reacts with the first layer to form a first nitride layer on the silicon oxide film and reacts with the second layer to form a second nitride layer on the silicon nitride film, wherein a thickness of the second nitride layer is greater than a thickness of the first nitride layer; and
   a3) exposing the substrate to an etching gas that etches the first nitride layer and the silicon oxide film, wherein the second nitride layer protects the silicon nitride film from etching by the etching gas.

2. The method of claim 1, further comprising:
   repeating steps a1) and a2) at least once before performing step a3).

3. The method of claim 1, further comprising:
   repeating steps a1), a2), and a3) at least once to further etch the silicon oxide film.

4. The method of claim 1, further comprising:
   a0) exposing the substrate to a H₂-containing gas that terminates the silicon oxide film with —OH surface species and terminates the silicon nitride film with —NH_x surface species.

5. The method of claim 4, further comprising:
   repeating a0), a1), a2), and a3) at least once to further etch the silicon oxide film.

6. The method of claim 4, further comprising:
   repeating a1), a2), and a3) at least once to further etch the silicon oxide film.

7. The method of claim 1, wherein the first gas contains a boron hydride, a boron halide, an organoaluminum compound, an aluminum hydride, an aluminum chloride, or a combination thereof.

8. The method of claim 1, wherein the first gas is selected from the group consisting of BH₃, BCl₃, BF₃, Al(CH₃)₃, AlH₃, AlCl₃, and a combination thereof.

9. The method of claim 1, wherein the nitrogen-containing gas is selected from the group consisting of a nitrogen hydride, a nitrogen halide, N₂, and a combination thereof.

10. The method of claim 1, wherein the nitrogen-containing gas is selected from the group consisting of NH₃, N₂H₄, NCl₃, N₂, and a combination thereof.

11. The method of claim 1, wherein the etching gas contains a fluorocarbon gas, a hydrofluorocarbon gas, a hydrochlorocarbon gas, a hydrochlorofluorocarbon gas, or a combination thereof.

12. The method of claim 1, wherein the etching gas is selected from the group consisting of CF₄, CF₂Cl₂, CH₂F₂, CH₄, CH₃F, CHF₃, C₄H₆, C₂H₄, C₃H₆, CH₂Cl₂, CH₃Cl, CHCl₂, CH₂ClF, CHCl₂F, and a combination thereof.

13. A substrate processing method, comprising:
   providing a substrate containing a silicon oxide film and a silicon nitride film;
   a1) exposing the substrate to a BCl₃ gas that forms a first BCl₃ layer on the silicon oxide film and a second BCl₃ layer on the silicon nitride film;
   a2) exposing the substrate to NH₃ gas that reacts with the first BCl₃ layer to form a first boron nitride layer on the silicon oxide film and reacts with the second BCl₃ layer to form a second boron nitride layer on the silicon nitride film, wherein a thickness of the second boron nitride layer is greater than a thickness of the first boron nitride layer; and
   a3) exposing the substrate to plasma-excited CF₄ gas that etches the first boron nitride layer and the silicon oxide film, wherein the second boron nitride layer protects the silicon nitride film from etching by the plasma-excited CF₄ gas.

14. The method of claim 13, further comprising:
   repeating steps a1) and a2) at least once before performing step a3).

15. The method of claim 13, further comprising:
   repeating a1), a2), and a3) at least once to further etch the silicon oxide film.

16. The method of claim 13, further comprising:
   a0) exposing the substrate to a H₂-containing gas that terminates the silicon oxide film with —OH surface species and terminates the silicon nitride film with —NH_x surface species.

17. The method of claim 16, further comprising:
   repeating a0), a1), a2), and a3) at least once to further etch the silicon oxide film.

18. The method of claim 16, further comprising:
   repeating a1), a2), and a3) at least once to further etch the silicon oxide film.

19. A substrate processing method, comprising:
providing a substrate containing a silicon oxide film and a silicon nitride film;
a1) exposing the substrate to a boron-containing gas that forms a first boron-containing layer on the silicon oxide film and a second boron-containing layer on the silicon nitride film;
a2) exposing the substrate to a nitrogen-containing gas that reacts with the first boron-containing layer to form a first boron nitride layer on the silicon oxide film and reacts with the second boron-containing layer to form a second boron nitride layer on the silicon nitride film, wherein a thickness of the second boron nitride layer is greater than a thickness of the first boron nitride layer that; and
a3) exposing the substrate to an etching gas that etches the first boron nitride layer and the silicon oxide film, wherein the second boron nitride layer protects the silicon nitride film from etching by the etching gas.

20. The method of claim 19, wherein the boron-containing gas is selected from the group consisting of $BH_3$, $BCl_3$, $BF_3$, and a combination thereof, the nitrogen-containing gas is selected from the group consisting of $NH_3$, $N_2H_4$, $NCl_3$, $N_2$, and a combination thereof, and the etching gas is selected from the group consisting of $CF_4$, $CF_2Cl_2$, $CH_2F_2$, $CH_4$, $CH_3F$, $CHF_3$, $C_4H_6$, $C_2H_4$, $C_3H_6$, $CH_2Cl_2$, $CH_3Cl$, $CH_3Cl$, $CH_2ClF$, $CHCl_2F$, and a combination thereof.

\* \* \* \* \*